(12) United States Patent
Lopez et al.

(10) Patent No.: US 11,486,251 B2
(45) Date of Patent: Nov. 1, 2022

(54) TURBINE SPEED DETECTION AND USE

(71) Applicant: ABB Schweiz AG, Baden (CH)

(72) Inventors: Camilo Lopez, Export, PA (US); Mark Foltz, Pittsburgh, PA (US); Steve Miller, Pittsburgh, PA (US); Kevin Dowdell, Pittsburgh, PA (US); Mark Wieland, Cranberry, PA (US); Alan Majors, Pittsburgh, PA (US); Xudong Yang, Beijing (CN)

(73) Assignee: ABB Schweiz AG, Baden (CH)

( * ) Notice: Subject to any disclaimer, the term of this patent is extended or adjusted under 35 U.S.C. 154(b) by 40 days.

(21) Appl. No.: 17/092,570

(22) Filed: Nov. 9, 2020

(65) Prior Publication Data
US 2021/0054790 A1   Feb. 25, 2021

Related U.S. Application Data

(63) Continuation of application No. PCT/US2019/031448, filed on May 19, 2019.
(Continued)

(51) Int. Cl.
*F01C 20/28* (2006.01)
*G01P 21/02* (2006.01)
(Continued)

(52) U.S. Cl.
CPC ............. *F01C 20/28* (2013.01); *F01D 17/06* (2013.01); *F01D 21/02* (2013.01); *F01K 13/003* (2013.01);
(Continued)

(58) Field of Classification Search
CPC .......... F01C 20/28; F01D 17/06; F01D 21/02; F01D 17/145; F01D 17/26; F02C 9/28; F02C 9/263; F02C 9/52; F02C 9/54; F02C 7/232; G01P 21/02; G01P 3/481; G01P 3/44; G01R 31/2829; H02J 3/381; H02J 3/40; F05D 2220/31; F05D 2260/80; F05D 2270/64; F05D 2270/02; F05D 2270/80; F05D 2270/804; F05D 2270/021–024;
(Continued)

(56) References Cited

U.S. PATENT DOCUMENTS 3,597,653 A * 8/1971 Moore ...................... G01P 3/60
361/240
4,020,685 A * 5/1977 Van Millingen ........ G01L 3/105
702/41
(Continued)

OTHER PUBLICATIONS

Search Report and Written Opinion, PCT Appln. No. PCT/US19/31448, 9 pgs, dated Aug. 29, 2019.

*Primary Examiner* — Mickey H France
(74) *Attorney, Agent, or Firm* — Leydig, Voit & Mayer, Ltd.

(57) ABSTRACT

A speed control system and a power load balance detector for a turbine is provided. The speed control system includes a speed wheel with a plurality of teeth. A timer stores a time stamp when each of the teeth passes by a speed probe. A first speed estimate is determined for overspeed protection, and a second speed estimate is determined for operational speed control. The power load balance detector trips or shuts down the turbine when an unbalance is above a first threshold and the speed of the turbine is above a second threshold.

12 Claims, 2 Drawing Sheets

Related U.S. Application Data

(60) Provisional application No. 62/669,042, filed on May 9, 2018, provisional application No. 62/669,057, filed on May 9, 2018, provisional application No. 62/669,048, filed on May 9, 2018, provisional application No. 62/669,070, filed on May 9, 2018, provisional application No. 62/669,063, filed on May 9, 2018.

(51) Int. Cl.
  G01R 31/28 (2006.01)
  F01D 17/06 (2006.01)
  F02C 9/28 (2006.01)
  F01D 21/02 (2006.01)
  H02J 3/38 (2006.01)
  H02J 3/40 (2006.01)
  F01K 13/00 (2006.01)
  F01K 13/02 (2006.01)
  F16K 37/00 (2006.01)

(52) U.S. Cl.
  CPC ............. *F01K 13/02* (2013.01); *F02C 9/28* (2013.01); *F16K 37/0041* (2013.01); *F16K 37/0083* (2013.01); *G01P 21/02* (2013.01); *G01R 31/2829* (2013.01); *H02J 3/381* (2013.01); *H02J 3/40* (2013.01); *F05D 2220/31* (2013.01); *F05D 2260/80* (2013.01); *F05D 2270/02* (2013.01); *F05D 2270/021* (2013.01); *F05D 2270/80* (2013.01)

(58) Field of Classification Search
  CPC ........... F05D 2270/304; F05D 2270/09; F05D 2270/091; F05D 2270/803; G01M 15/14
  USPC ........................................ 415/16; 73/862.328
  See application file for complete search history.

(56) References Cited

U.S. PATENT DOCUMENTS

| | | | | |
|---|---|---|---|---|
| 4,183,242 A * | 1/1980 | Brown | .................... | G01L 3/101 73/862.328 |
| 4,356,447 A * | 10/1982 | Honig | .................... | F02P 7/061 324/392 |
| 4,434,470 A * | 2/1984 | Thomas | .................. | G01P 3/489 702/147 |
| 4,485,452 A * | 11/1984 | Cording | .................. | G01P 3/489 702/147 |
| 4,506,339 A * | 3/1985 | Kuhnlein | .............. | G01P 13/045 332/166 |
| 4,602,515 A * | 7/1986 | Eichenlaub | ............. | G01L 3/105 702/41 |
| 4,635,209 A * | 1/1987 | Hwang | .................... | F01K 7/165 700/290 |
| 4,715,009 A * | 12/1987 | Bohmler | ................. | G01P 3/489 702/147 |
| 4,746,862 A * | 5/1988 | Ueki | ....................... | G01P 3/487 341/15 |
| 4,774,845 A * | 10/1988 | Barbe | ..................... | G01L 3/101 73/862.328 |
| 4,972,332 A * | 11/1990 | Luebbering | ............. | G01P 3/481 340/672 |
| 5,165,271 A * | 11/1992 | Stepper | .................. | G01D 5/142 73/114.25 |
| 5,371,460 A * | 12/1994 | Coffman | ............... | G01P 13/045 340/672 |
| 5,508,609 A * | 4/1996 | Parkinson | ................ | G01B 7/31 340/870.3 |
| 5,537,322 A * | 7/1996 | Denz | ..................... | G01P 15/165 73/114.25 |
| 5,559,705 A * | 9/1996 | McClish | ................ | G01M 15/11 73/114.25 |
| 5,789,658 A * | 8/1998 | Henn | ...................... | G01P 21/02 73/114.25 |
| 5,933,005 A * | 8/1999 | Pugh | .................... | G01D 5/2457 341/15 |
| 6,131,547 A * | 10/2000 | Weber | ................. | F02D 41/0097 73/114.25 |
| 6,445,995 B1 * | 9/2002 | Mollmann | .............. | G01P 3/481 235/103 |
| 6,727,686 B2 * | 4/2004 | Beckmann | ........... | G01D 5/2457 324/207.25 |
| 8,100,000 B1 * | 1/2012 | Rankin | ................. | G01D 5/2457 73/114.77 |
| 8,222,760 B2 * | 7/2012 | Menke | ..................... | H02P 9/04 416/61 |
| 8,352,149 B2 * | 1/2013 | Meacham | ............... | F01D 21/14 702/33 |
| 8,428,784 B2 * | 4/2013 | Krueger | ................. | F03D 7/042 416/61 |
| 8,464,598 B2 * | 6/2013 | Cazaux | .................. | G01L 3/109 73/862.08 |
| 9,140,718 B2 * | 9/2015 | O'Neil | ................... | G01P 3/481 |
| 9,708,926 B2 * | 7/2017 | Curlier | ................... | G01L 3/105 |
| 10,371,072 B2 * | 8/2019 | Gouzenne Coutier | ...................... | F02D 41/009 |
| 10,392,962 B2 * | 8/2019 | Rowe | ........................ | G01P 3/46 |
| 10,487,683 B2 * | 11/2019 | Gerez | ..................... | F01D 21/04 |
| 2004/0050178 A1 * | 3/2004 | Parkinson | ............... | G01L 3/109 73/862.328 |
| 2008/0110283 A1 | 5/2008 | Shaver et al. | | |
| 2010/0088003 A1 * | 4/2010 | Meacham | ............. | F01D 21/003 701/100 |
| 2013/0098042 A1 | 4/2013 | Frealle et al. | | |
| 2013/0289933 A1 * | 10/2013 | Hess | ........................ | G01P 21/02 702/145 |
| 2014/0070794 A1 | 3/2014 | Cosby et al. | | |
| 2015/0096371 A1 * | 4/2015 | O'Neil | .................... | G01P 3/481 73/488 |
| 2015/0211380 A1 * | 7/2015 | Curlier | .................... | F02K 3/025 415/118 |
| 2016/0090918 A1 * | 3/2016 | Certain | ...................... | F02C 3/04 415/16 |
| 2016/0291052 A1 * | 10/2016 | Riolo | ....................... | G01P 21/02 |
| 2017/0343575 A1 * | 11/2017 | Brown | ...................... | G01P 3/4807 |
| 2017/0356300 A1 * | 12/2017 | Domnick | .............. | F01D 17/145 |
| 2018/0003073 A1 * | 1/2018 | Rowe | ........................ | F02C 9/00 |
| 2018/0031594 A1 | 2/2018 | Joseph et al. | | |
| 2018/0050789 A1 * | 2/2018 | Marone | ................. | B64C 11/301 |
| 2018/0050816 A1 * | 2/2018 | Yakobov | ................. | B64C 11/30 |

* cited by examiner

TURBINE SPEED DETECTION AND USE

BACKGROUND

The present inventions relate generally to turbines, and more particularly, to detecting the speed thereof and using a detected speed.

Electrical power plants employ large steam turbines to generate electricity. In a steam turbine, the speed of the turbine is a critical factor in the control of the turbine. The inventions disclosed herein provide new and improved methods for detecting the speed of a turbine and using a detected speed for controlling the turbine.

BRIEF DESCRIPTION OF SEVERAL VIEWS OF THE DRAWINGS

The invention may be more fully understood by reading the following description in conjunction with the drawings, in which.

DETAILED DESCRIPTION

Figure 1:
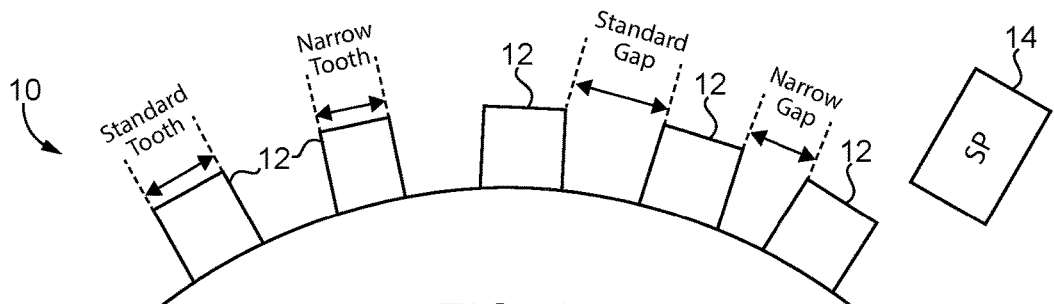
FIG. 1 is a schematic of a speed wheel 10 with teeth 12 for determining the speed of a turbine.

One aspect of the preferred embodiments includes a turbine speed determination that uses a speed probe to measure the time between pulses from a multi-tooth speed wheel similar to a gear. The speed determination may be used for two different purposes: 1) to protect the turbine from overspeed, which requires a very fast speed determination; and 2) to perform closed loop speed control in the turbine governor, which requires a very precise speed determination. It can be challenging to address both of these requirements with the same solution.

The speed determination counts the number of pulses every millisecond and measures the time difference to calculate speed for overspeed protection. Additionally, each pulse is time-stamped with a high precision timer. The algorithm counts the number of pulses for a full revolution of the shaft as specified by the "Number of Teeth" parameter. This method determines the speed from the same tooth each time eliminating any physical manufacturing errors with the speed wheel. Each execution of the algorithm uses a different tooth to compute the full revolution speed calculation providing frequent and precise speed and acceleration values for better control of the turbine.

It should be noted that enforcing a full rotation determination of speed will typically cause the speed report to suffer from high latency when operating at lower speeds, even with multi-tooth speed wheels. To overcome this limitation, dynamic averaging may be implemented to allow as few as two teeth to calculate reported speed to limit the maximum speed report latency to a configurable level. The determination may automatically utilize all available speed pulse readings to calculate speed when the speed report latency would be greater than the configurable level.

Each time a tooth on the speed wheel passes the speed probe, an interrupt occurs that stores the high precision time stamp in a 65536 element array. After storing the time stamp the array index increments to the next element in the array. Since the index is an unsigned 16-bit integer, the index will roll over to 0 once the index reached the maximum value (65535 or 0xFFFF). When the firmware calculates the current speed, it reads the most recent time stamp and subtracts the number of teeth from the current index and reads the time stamp from that pulse. By subtracting the number of teeth, the time stamp is a full revolution, therefore using the same tooth as a reference, thus eliminating any physical errors in the speed wheel. By taking the difference between the two time stamps, the firmware can determine the time for a full revolution. By taking the inverse of the delta-time (1/delta-time), the speed can be determined in revolutions/second. Then by multiplying by 60 (seconds/minute) the speed converts to revolutions per minute (RPM).

One feature of the described inventions is a time-stamp array of each pulse from the speed wheel. The number of teeth on the speed wheel is used by the firmware to determine the number of pulses per revolution of the shaft. A high precision timer is used to provide precise speed measurements. A fast acting algorithm provides frequent speed calculations for protection and control. Dynamic averaging may be implemented to allow as few as two teeth to calculate reported speed to limit the maximum speed report latency to a configurable level. The algorithm will automatically utilize all available speed pulse readings to determine speed when the speed report latency would be greater than the configurable level.

FIG. 1 illustrates how the speed wheel can vary between the width of the teeth and the width of the gap between the teeth. This variance can cause errors in the time between pulses thus causing errors in the speed calculation. By using the same tooth to determine the speed, physical errors in the speed wheel can be eliminated.

In the preferred embodiments are two speed determinations may be used, one focused on a fast speed reading (2 msecs) for turbine protection purposes, and one focused on precision (fill rotation speedwheel) for turbine control purposes. The full rotation speed wheel moving average speed determination eliminates the error from physical variations of the speed wheel. Enforcing a full rotation determination of speed will cause the speed report to suffer from high latency when operating at lower speeds, even with multi-tooth speed wheels. To overcome this limitation, dynamic averaging may be implemented to allow as few as two teeth to calculate reported speed to limit the maximum speed report latency to a configurable level. The algorithm will automatically utilize all available speed pulse readings to determine speed when the speed report latency would be greater than the configurable level. Some prior approaches have only used a portion of the wheel to measure speed, which does not compensate for the physical variations thus causing fluctuations in the speed reading. This makes it more difficult to control the turbine. Another improvement is the use of a large array that allows the method to determine a precise speed measurement using a different tooth each time providing a faster response.

The principal applications for the preferred embodiments are generally large steam turbines at electrical power plants. The uses of the preferred embodiments are at least twofold. First, it provides overspeed protection for the machine. If the rotor spins too fast it becomes a dangerous situation creating a high risk of extensive equipment damage and a hazardous condition to personnel that may be in the vicinity of the machine. The second application provides the operator and control system the means to regulate the rotation of the shaft at the desired speed with high accuracy. Additionally, it can provide an indication of rotational acceleration, which can be used to control the increase in speed as the machine ramps to the desired speed. Furthermore, other smaller machines may require similar safety and control, so the preferred embodiments are not limited to large steam turbines, but may include other types of rotating machinery.

The preferred embodiments provide a stable and accurate measure of speed. However, overspeed protection requires faster than one revolution response. Therefore, the preferred embodiments may also use a partial revolution to determine a less accurate, but earlier measurement providing faster protection. The preferred embodiments overcome the problem of physical inaccuracies of the speed wheel, thus providing a more accurate speed measurement. These inaccuracies are primarily due to slightly different spacing of the teeth on the wheel during the manufacturing process. Since the same tooth is used for each measurement any defect is eliminated. Additionally, the preferred embodiments maintain an array so it can track each tooth individually, therefore it can generate a new speed measurement as each tooth passes the speed sensor. Moreover, it does not have to wait for a full revolution to determine speed.

One advantage of the preferred embodiments is providing a more stable speed measurement. Another advantage is providing a more precise speed measurement. Another advantage is that the preferred embodiments can handle any size speed wheel used for overspeed protection and control. Another advantage is eliminating the need for manufacturing high precision speed wheels.

The preferred embodiments overcome the problems of prior systems by counting the number of teeth with each reading so it can provide a more stable and precise speed measurement. The preferred embodiments also overcome jitter in the speed measurement allowing for easier logic in the controller. For example, some controllers may have to provide an averaging algorithm in the control logic. The preferred embodiments may also use dynamic averaging to allow as few as two teeth to calculate reported speed to limit the maximum speed report latency to a configurable level. The algorithm may automatically utilize all available speed pulse readings to calculate speed when the speed report latency would be greater than the configurable level.

Another aspect of the preferred embodiments relates to power load unbalance. Typically, power load unbalance compares the mechanical load of an electric power generating turbine with the electrical load. When a large difference between the mechanical and electrical loads occurs this creates an unbalance condition, which oftentimes leads to the potential of an overspeed condition that can damage equipment and pose a danger to personnel. There are several methods of determining power load unbalance (PLU) depending on the type of turbine and turbine manufacturer. However, these methods do not take into account the speed of the turbine, which can result in unnecessary turbine shutdowns. The preferred embodiments use the speed of the turbine to determine whether the unbalance condition justifies a turbine shutdown.

To determine the power load unbalance, the method requires the following parameters: rated pressure, rated generator amps, RSPLU (Rate Sensitive Power Load Unbalance) setpoint, RSPLU maximum rate, RSPLU hold time, RSPLU activation, rated load (e.g., megawatts), CIV setpoint and speed setpoint. To determine the power load unbalance, the method requires the following input values: reheat pressure, generator amps, megawatts and speed. The module provides the following outputs: RSPLU delta power, RSPLU latch, RSPLU active and RSPLU pulse.

The method divides the reheat pressure and generator amps by the corresponding rated values and multiplies by 100 to convert to a percentage of the rated inputs values. It then takes the difference between the rated pressure and rated amp percentages, which determines the delta power. If the delta power is above the specified setpoint, a flag is set as a potential for power load unbalance.

Additionally, it calculates the maximum rate of change for the generator amps. It determines the current rate of change and subtracts it from the maximum allowable rate. If the difference is negative, indicating the change in generator amps exceeds the maximum, it sets another flag for the potential of power load unbalance.

Furthermore, the method compares the current turbine speed with a setpoint, which sets a permissive flag when the speed exceeds that setpoint. Permissivity is a particularly useful feature of the preferred embodiments.

If the delta power, rate of change, speed permissive, and the RSPLU activation flags are all set, the method sets the RSPLU active flag. The RSPLU active flag remains true as long as the conditions exist or for a minimum hold time.

In addition to the normal parameters to calculate power load unbalance, the preferred embodiments rely upon the turbine speed and the speed setpoint. When the speed exceeds the setpoint, it sets a permissive for the RSPLU condition.

Figure 2:
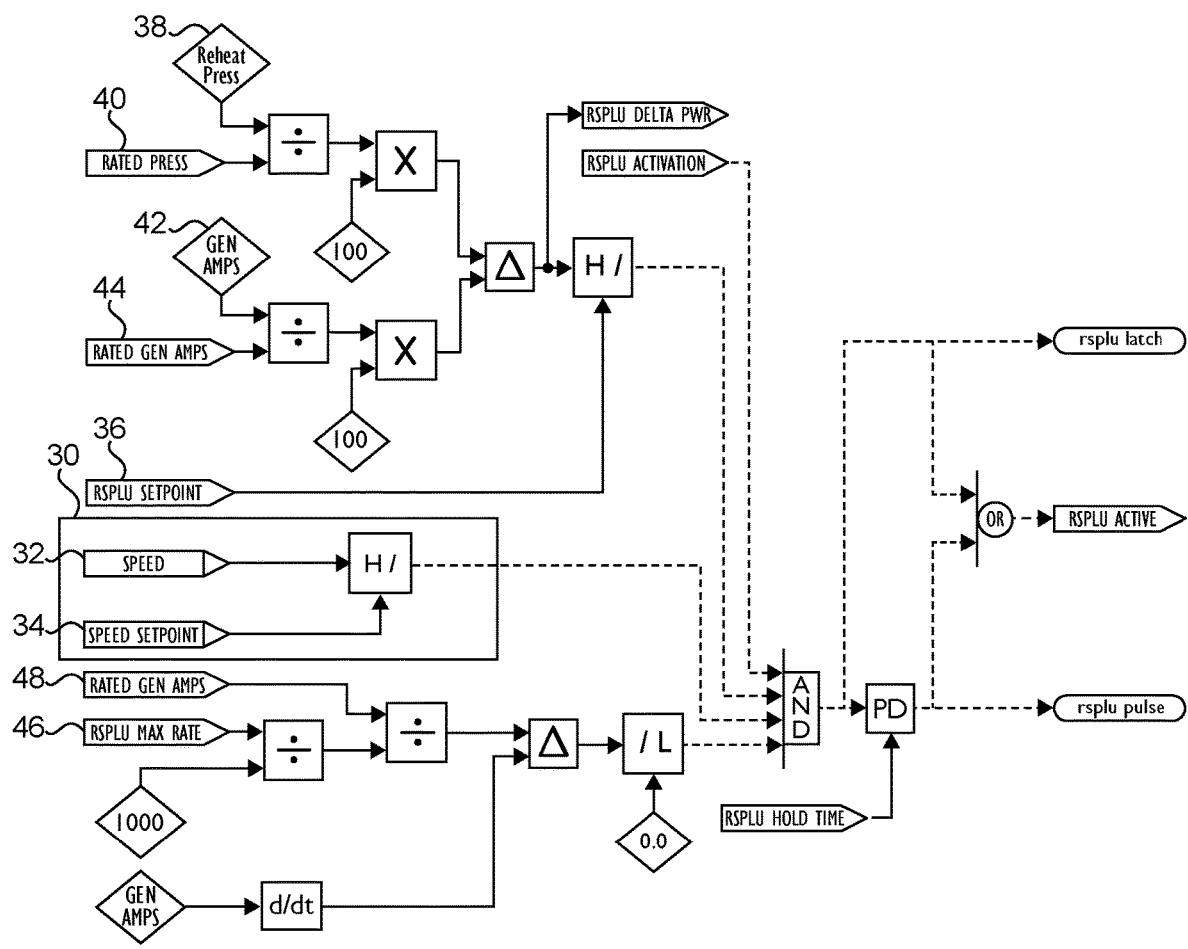
FIG. 2 is a block diagram of a power load balance detector for tripping or shutting down a turbine.

One improvement of the preferred embodiments is the addition of the turbine speed 32 and the speed setpoint 34, identified as inputs 30 in FIG. 2.

The principal applications for the preferred embodiments are generally large steam turbines at electrical power plants. An advantage of the preferred embodiments is that it provides overspeed protection for the machine. If the rotor spins too fast, it becomes a dangerous situation where there is a high risk of extensive equipment damage and a hazardous condition to personnel that may be in the vicinity of the machine. Likewise, other smaller machines may require similar safety and control, so this is not limited to large steam turbines, but may include other types of rotating machinery.

One problem that the preferred embodiments overcome is avoiding unnecessary trips or shutdowns when the speed of the rotor is not spinning at dangerous levels. Generally, the load unbalance protects against the potential of an overspeed condition. However, if the module detects a load unbalance condition but the speed is relatively low there is no risk of an overspeed condition. Consequently, under these conditions the operators may have a difficult time starting the turbine due to needless trips.

One advantage of the preferred embodiments is the elimination of unnecessary trips during startup. Another advantage is allowing faster and more efficient startups. Another advantage is maintaining the load unbalance protection above certain speeds. Another advantage is that the method can be disabled if the operator so desires.

The module contains additional logic that compares the current speed with a user provided setpoint to enable the load unbalance protection. This only requires an additional parameter to implement the new logic. All of the logic may be built into the module so the user does not have to configure external logic in the controller.

Another aspect of the preferred embodiments involves flexible sensitivity turbine speed detection. When measuring turbine speed with speed probes, the amplitudes and shape of the signal can vary significantly with probe type, probe position and the speed of the shaft. The preferred embodiments allow the user to select different sensitivity settings to measure speed with different amplitudes using the same modules. A typical active speed probe generates pulses (e.g., square waves) between 0 and 24 volts, while passive speed probes produce sinusoidal waves of varying amplitudes as the turbine speed changes. The preferred embodiments allow the same device and the same speed circuit to measure amplitudes as low as 50 millivolts and up to 120 $V_{RMS}$, providing for a high level of noise immunity at the low end and the appropriate circuit safety protections at the high end. The advantage of the preferred embodiments enables the same module and the same circuit to detect speed with very low amplitude signals (capable of reading a turbine speed wheel with passive probes) while modifying the sensitivity to eliminate noise that may generate false measurements.

The turbine speed circuit allows for the reading of very low speed probe amplitude signals (50 mV) as well as high amplitude signals (120 VAC) while providing a flexible adjustable mechanism for dealing with potential noise interference. The module provides options for three different amplitude settings. The amplitude setting is the minimum voltage that the module will recognize as a speed pulse. The three levels are 50 mv, 400 mv, and 4 volts. The dipswitch S2 selects different resistor and capacitor combinations to enable different gains and filter settings allowing for more or less sensitivity, and noise rejection. By setting the different switches, the resistors are changed that determine the gain of the op-amp. The table below shows the switches to set for the different levels.

| 50 mv | 400 mv | 4 volts |
|---|---|---|
| SW 3-6 OPEN | SW 3 & 6 CLOSED | SW 3 & 6 OPEN |
|  | SW 4 & 5 OPEN | SW 4 & 5 CLOSED |
| Gain = 40X | Gain = 6X | Gain = 0.5X |

The trigger threshold after the circuit for all three settings is about 2 volts. Therefore, the gains for each configuration sets the target to 2 volts. Additionally, the module clamps the input to the circuit to ±12 volts and the output to ±3.3 volts to prevent any damage to the components.

For active speed probes, the amplitude of the pulses goes between 0 and 24 volts, therefore the 4 volts setting works best because any noise on the input does not affect the speed measurements.

However, with passive probes the amplitude of the signal varies with speed, so at lower speeds the circuit may not detect the pulses that determine the speed of the machine. Therefore, the lower level settings allow the module to detect the pulses at lower speeds. Consequently, noise on the input signal becomes a concern since it may generate false readings. Therefore, the module provides three optional filter settings to reduce the nose level that may cause false triggering. The table below shows the different filter settings.

| No Filter | Heavy Filter | Light Filter |
|---|---|---|
| SW 1 & 2 OPEN | SW 1 CLOSED | SW 1 OPEN |
|  | SW 2 OPEN | SW 2 CLOSED |
| C = N/A | C = 27 pF | C = 100 pF |
| No Filter | 50 mv = 4.79 KHz | 50 mv = 17.75 KHz |
|  | 400 mv = 38.3 KHz | 400 mv = 141.85 KHz |
|  | 4.0 V = 391.09 KHz | 4.0 V = 1.44 MHz |

The cut-off frequency for filtering may be determined using the formula:

$$F_c = 1/(2*\pi*C*R_{fb})$$

The $R_{fb}$ varies depending on the Amplitude Gain, such that, $R_{fb} = 332K \| R_g$ (i.e., a fixed resister (e.g., 332K) is in parallel with a selectable gain resister $R_g$), where Rg is the resistance set by switches 2 and 3.

The default setting is 400 my since it provides the best compromise with the different probe types and works for most cases. Whenever the need to read lower speeds with the passive probe, or the module generates a false pulse causing incorrect speed measurements, the user can adjust the settings to provide an acceptable response.

Important features of the preferred embodiments include: switchable options, gain settings, noise filters and overvoltage clamps.

Figure 3:
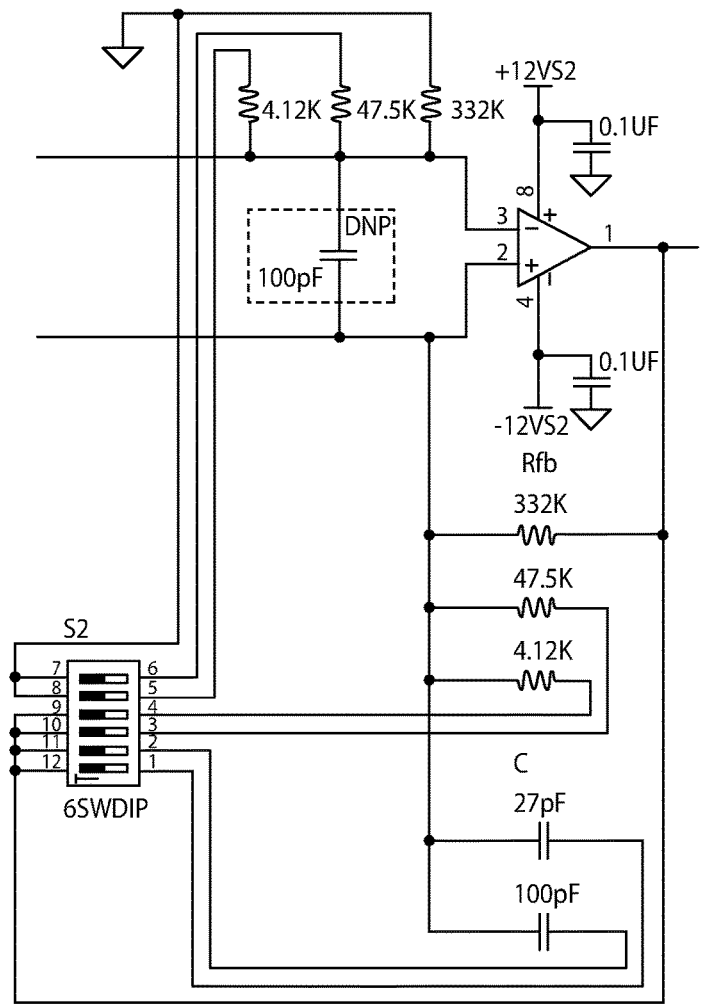
FIG. 3 is a circuit diagram for applying various gains and filters to a speed signal.
Figure 4:
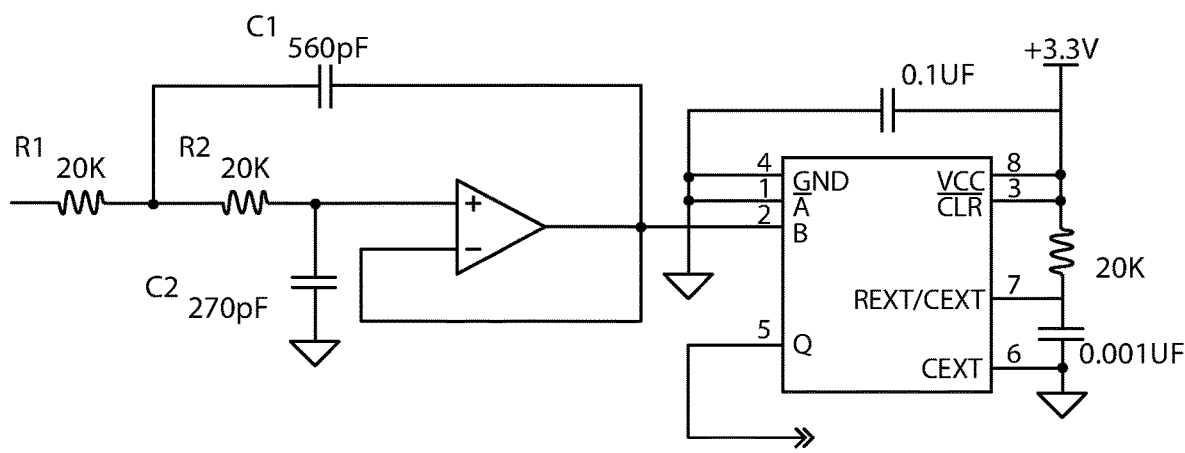
FIG. 4 is a circuit diagram for determining the speed of the turbine using the output of FIG. 3.

An exemplary circuit for applying the gain and filter to an analog speed signal is shown in FIG. 3. An exemplary circuit for converting the analog output from the circuit of FIG. 3 to a digital signal that may be used by a processor to determine frequency (i.e., speed) is shown in FIG. 4.

The preferred embodiments allow for the reading of very low amplitude signals (e.g., speed wheel with passive probes) while properly eliminating noise interference and while also allowing for the same circuit to be used for much higher amplitude signals. Some prior methods only provided a fixed threshold while the preferred embodiments allow for a variable threshold. Some prior methods also have a fixed noise filter while the preferred embodiments provide an adjustable noise filter.

The principal applications for the preferred embodiments are generally large steam turbines at electrical power plants. The uses of the preferred embodiments are twofold. First, it provides a means to eliminate false pulses by increasing the threshold. Second, it allows the user to select lower thresholds if the sensors generate low amplitude signals. Additionally, different applications may include other types of rotating machinery that require speed indication.

The preferred embodiments avoid false triggers with some speed probes due to excessive noise and allowing speed detection at smaller amplitudes. Furthermore, the preferred embodiments help to optimize the difference between active and passive speed probes.

One advantage of the preferred embodiments is decreasing the chance of false triggers due to excessive noise. Another advantage is allowing speed detection from lower amplitude signals. Another advantage is optimizing the characteristics between active and passive speed probes.

An improvement of the preferred embodiments is dipswitches that modify the gain of the speed circuit allowing different thresholds. Another improvement is different filters to adjust the noise rejection. Another improvement is upper and lower thresholds to provide hysteresis at different levels.

If desired, the preferred embodiments may include a different number of threshold settings along with a different number of filter settings. The preferred embodiments may also include a different method of adjusting the thresholds, for example using software to change the setting or provide a means of automatically adjusting the setting for optimal response.

The inventions as described herein may have one or more of the following features in addition to any of the features described above. Referring to the figures, the following features are shown.

A speed control system for a turbine including a speed wheel 10 attached to and rotatable with the turbine, the speed wheel comprising a plurality of teeth 12; a speed probe 14 providing an indication each time one of the plurality of teeth passes the speed probe; a timer providing a time stamp for each of the indications; a memory storing each of the time stamps; a first speed estimate based on a difference between two of the time stamps; a second speed estimate based on a difference between two of the time stamps; the first speed estimate being used in an overspeed protection; and the second speed estimate being used in an operational speed control; wherein the teeth for the time stamps of the second speed estimate are spaced farther apart around the speed wheel than the teeth for the time stamps of the first speed estimate, the first speed estimate thereby being determined quicker than the second speed estimate and the second speed estimate being more accurate than the first speed estimate.

The speed control system wherein the overspeed protection trips or shuts down the turbine.

The speed control system wherein the overspeed protection closes one or more valves to terminate a supply of a fluid or a gas to power the turbine.

The speed control system wherein the operational speed control modulates one or more valves to adjust a supply of a fluid or a gas to power the turbine.

The speed control system wherein the second speed estimate is determined by comparing two of the time stamps for a same tooth of the plurality of teeth, the second speed estimate thereby being based on one complete revolution of the speed wheel.

The speed control system wherein the plurality of teeth have varying widths or spacing therebetween.

The speed control system wherein the memory comprises an indexable array storing the time stamps.

A power load balance detector including a power generating turbine; a mechanical load supplying power to the power generating turbine; an electrical load produced by the power generating turbine; a speed detector detecting a speed 32 of the power generating turbine; an unbalance protection configured to trip or shutdown the power generating turbine when an unbalance between the mechanical load and the electrical load is above a first threshold and the speed 32 of the power generating turbine is above a second threshold 34.

The power load balance detector wherein the first threshold comprises setpoint 36 for a difference between a ratio of actual pressure 38 to rated pressure 40 and a ratio of actual amperage 42 and rated amperage 44.

The power load balance detector further comprising a third threshold comprising a setpoint 46 for a rate of change of actual amperage 48, the unbalance protection configured to trip or shutdown the power generating turbine when an unbalance between the mechanical load and the electrical load is above the first threshold, the speed of the power generating turbine is above the second threshold, and the rate of change of the actual amperage is above the third threshold.

The power load balance detector wherein the first threshold comprises a setpoint 46 for a rate of change of actual amperage 48.

It is understood that the preferred embodiments described herein may be implemented as computerized methods in a non-transitory computer readable medium if desired.

While preferred embodiments of the inventions have been described, it should be understood that the inventions are not so limited, and modifications may be made without departing from the inventions herein. While each embodiment described herein may refer only to certain features and may not specifically refer to every feature described with respect to other embodiments, it should be recognized that the features described herein are interchangeable unless described otherwise, even where no reference is made to a specific feature. It should also be understood that the advantages described above are not necessarily the only advantages of the inventions, and it is not necessarily expected that all of the described advantages will be achieved with every embodiment of the inventions. The scope of the inventions is defined by the appended claims, and all devices and methods that come within the meaning of the claims, either literally or by equivalence, are intended to be embraced therein.

The invention claimed is:

1. A speed control system for a turbine, comprising:
a speed wheel attached to and rotatable with the turbine, the speed wheel comprising a plurality of teeth;
a speed probe providing an indication each time one of the plurality of teeth passes the speed probe;
a timer providing a time stamp for each of the indications;
a memory storing each of the time stamps;
a first speed estimate based on a difference between two of the time stamps;
a second speed estimate based on a difference between two of the time stamps;
the first speed estimate being used in an overspeed protection; and
the second speed estimate being used in an operational speed control;
wherein the teeth for the time stamps of the second speed estimate are spaced farther apart around the speed wheel than the teeth for the time stamps of the first speed estimate, the first speed estimate thereby being determined quicker than the second speed estimate and the second speed estimate being more accurate than the first speed estimate.

2. The speed control system according to claim 1, wherein the overspeed protection trips or shuts down the turbine.

3. The speed control system according to claim 2, wherein the overspeed protection closes one or more valves to terminate a supply of a fluid or a gas to power the turbine.

4. The speed control system according to claim 1, wherein the operational speed control modulates one or more valves to adjust a supply of a fluid or a gas to power the turbine.

5. The speed control system according to claim 1, wherein the second speed estimate is determined by comparing two of the time stamps for a same tooth of the plurality of teeth, the second speed estimate thereby being based on one complete revolution of the speed wheel.

6. The speed control system according to claim 1, wherein the plurality of teeth have varying widths or spacing therebetween.

7. The speed control system according to claim 1, wherein the memory comprises an indexable array storing the time stamps.

8. The speed control system according to claim 1, wherein the second speed estimate is determined by comparing two of the time stamps for a same tooth of the plurality of teeth, the second speed estimate thereby being based on one complete revolution of the speed wheel, and the plurality of teeth have varying widths or spacing therebetween.

9. The speed control system according to claim 8, wherein the memory comprises an indexable array storing the time stamps.

10. The speed control system according to claim 9, wherein the overspeed protection trips or shuts down the turbine.

11. The speed control system according to claim 10, wherein the overspeed protection closes one or more valves to terminate a supply of a fluid or a gas to power the turbine.

12. The speed control system according to claim 11, wherein the operational speed control modulates the one or more valves to adjust the supply of the fluid or the gas to power the turbine.

* * * * *